(12) United States Patent
Brouillette et al.

(10) Patent No.: US 7,700,945 B2
(45) Date of Patent: Apr. 20, 2010

(54) ON-CHIP STORAGE OF HARDWARE EVENTS FOR DEBUGGING

(75) Inventors: Pat Brouillette, Scottsdale, AZ (US); Jason G. Sandri, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 688 days.

(21) Appl. No.: 11/471,790

(22) Filed: Jun. 21, 2006

(65) Prior Publication Data
US 2008/0008289 A1    Jan. 10, 2008

(51) Int. Cl.
*H01L 23/58* (2006.01)

(52) U.S. Cl. .......................................... 257/48; 438/14

(58) Field of Classification Search ............... 257/48; 438/14
See application file for complete search history.

(56) References Cited

U.S. PATENT DOCUMENTS 5,408,639 A * 4/1995 Gulick et al. ............... 713/501

* cited by examiner

*Primary Examiner*—Long Pham
(74) *Attorney, Agent, or Firm*—Buckley, Maschoff & Talwalkar LLC

(57) ABSTRACT

An integrated circuit (IC) die includes a plurality of edge counters. Each edge counter is provided to detect at least one change in signal level at a respective location on the IC die. The IC die is in communication with a memory and also includes an event recording circuit on the IC die provided to store states of the counters in the memory.

7 Claims, 4 Drawing Sheets

ON-CHIP STORAGE OF HARDWARE EVENTS FOR DEBUGGING

BACKGROUND

Some integrated circuit (IC) processing devices handle tasks such as media processing in which there is critical timing for event handling by software. Debugging such devices may be quite difficult because there may be no readily available way to determine the relative timing at which software and hardware events occur. In particular, there may be no convenient way of detecting the timing of hardware events such as video input and output "ticks", MPEG transport stream packet arrivals, core CPU interrupts, and program clock-recovery updates. Existing techniques for detecting hardware states may involve logic analyzers, which are expensive, require debug probe points on the IC and motherboard, and do not readily correlate with execution of the platform software.

DETAILED DESCRIPTION

Figure 1:
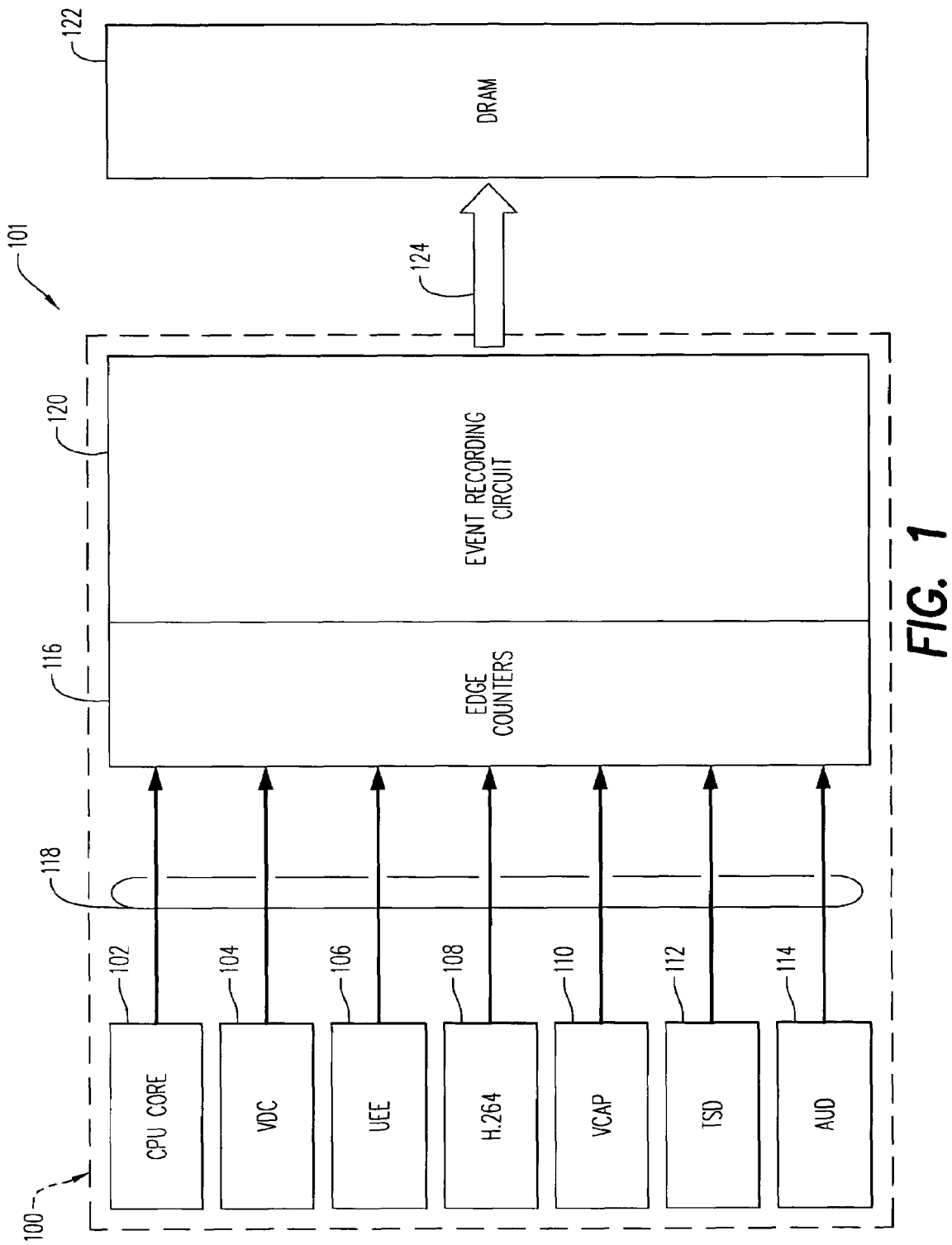
FIG. 1 is a schematic block diagram illustration of an apparatus provided according to some embodiments.

FIG. 1 is a schematic block diagram illustration of an apparatus 101 that includes an IC die 100 (indicated schematically by a dashed line box) provided according to some embodiments.

The IC die 100 may, for example, be a so-called system-on-a-chip (SoC) device incorporating various processing functions in a single IC. The IC die 100 may largely or entirely comprise digital logic circuitry. In the example embodiment shown in FIG. 1, the IC die may include the following circuit blocks formed thereon: (a) a CPU core 102 to perform conventional functions such as those performed by a microprocessor; (b) a video display controller block 104; (c) an encryption engine block 106 for performing data encryption and/or decryption functions; (d) a video data coding/decoding block 108 for, e.g., decoding video data that was compression-encoded in accordance with the well-known H.264 standard and/or for compression encoding video data in accordance with that standard; (e) a video data capture block 110; (f) a transport stream demultiplexer block 112; and (g) an audio data decoding and/or encoding block 114.

Some or all of the IC blocks 102-114 may function in a conventional manner. Although not shown in the drawing, suitable interconnections may be provided among the IC blocks 102-114 to permit exchange of data and/or control signals among the IC blocks 102-114. Any one or more of the blocks 102-114 may be omitted from the IC die 100 in some embodiments, and/or other blocks performing other or additional functions may be present or may be substituted for one or more of the blocks 102-114. For example, the IC die 100 may include one or more circuit blocks (not shown) to allow the circuitry on the IC die 100 to engage in data communication with devices external to the IC die 100.

In accordance with some embodiments, the IC die may include (i.e., have formed thereon) a plurality of edge counter circuits ("edge counters") 116. In some embodiments, there may be provided, for example, hundreds of edge counters. The function of each edge counter 116 is to detect changes in digital logic signal levels (i.e., transitions from one logic state to another—from "high" to "low" or vice versa, or from "true" to "false" or vice versa, or from "on" to "off" or vice versa, or from "1" to "0" or vice versa) at a respective location on the IC die 100. For any given one of the edge counters 116 the respective location that it monitors may be in any one of the circuit blocks 102-114 or may be at another part of the circuitry of the IC die 100. Each of the edge counters may be connected to the location that it monitors by a respective signal line, with the signal lines being collectively and schematically illustrated at 118. Each edge counter may, for example, be a two-bit counter, and may function such that the state of the edge counter is "0" (binary "00") when there has been no signal transition at the monitored location since the edge counter was last cleared; the state of the edge counter is "1" (binary "01") when there has been exactly one signal transition at the monitored location since the edge counter was last cleared; the state of the edge counter is "2" (binary "10") when there have been exactly two signal transitions (i.e., a narrow pulse or a pulse of some width has occurred) at the monitored location since the edge counter was last cleared; or the state of the edge counter is "3" (binary "11") when there have been at least three signal transitions at the monitored location since the edge counter was last cleared. Accordingly, a "0" state of the edge counter indicates that there has been no change in logic level at the monitored location since the edge counter was last cleared; a "1" state of the edge counter indicates that the logic level at the monitored location has changed once and only once since the edge counter was last cleared; a "2" state of the edge counter indicates that the logic level at the monitored location has changed twice and only twice since the edge counter was last cleared; and a "3" state of the edge counter indicates that the logic level at the monitored location has changed at least three times since the edge counter was last cleared.

The IC die 100 also may include (i.e., have formed thereon) an event recording circuit 120. In the embodiment illustrated in FIG. 1, the edge counters 116 may be located on the IC die 100 adjacent the event recording circuit 120. As will be seen, the event recording circuit 120 may operate to read the states of the edge counters 116 and to store the states of the edge counters 116 in a memory (e.g., DRAM 122) included in the apparatus 101 and coupled to the IC die 100. Coupling of the memory 120 to the IC die 100 is schematically indicated by arrow mark 124. Although not shown in the drawing, there may be one or more signal line connections between DRAM 122 and CPU core 102 and/or other circuit blocks of the IC die 100. The event recording circuit 120 may include logic circuitry (not separately shown) to perform the functions described below.

Figure 2:
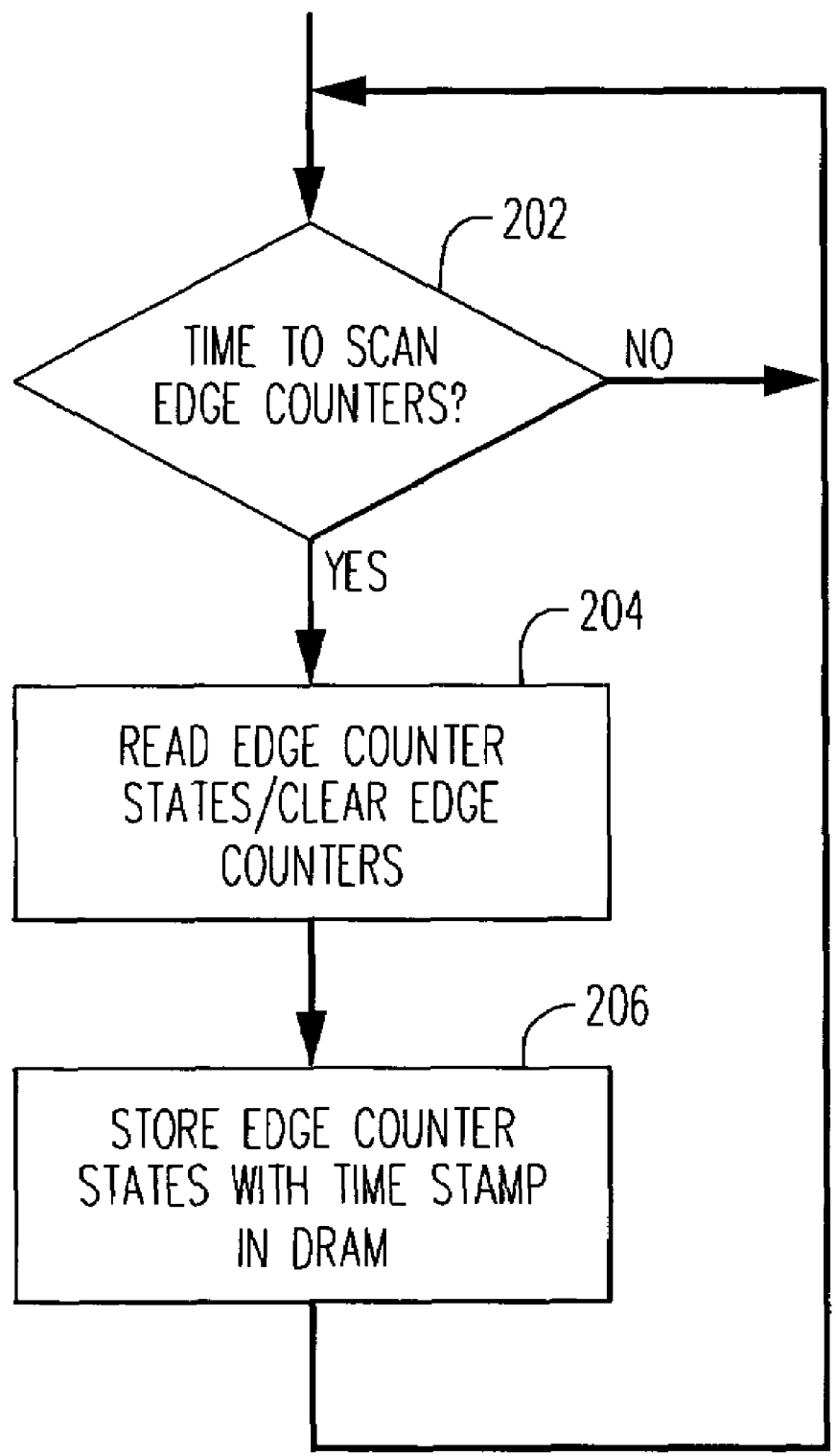
FIG. 2 is a flow chart that illustrates a process that may be performed by the apparatus of FIG. 1.

FIG. 2 is a flow chart that illustrates a process that may be performed by the event recording circuit 120. The event recording circuit may operate to scan the edge counters 120 at regular intervals. Thus, at 202 there is a decision block at which the event recording circuit 120 determines whether a pre-determined point in time has arrived at which the scanning of the edge counters has been scheduled. In some embodiments, the duration of the intervals between scanning times may be programmable by software and/or data loaded into the IC die 100. In other words, the frequency of the scanning of the edge counters may be programmable.

At 204, the event recording circuit 120 reads the states of the edge counters 116. In some embodiments, the same operation may result in clearing the edge counters 116. Assuming the edge counters are two-bit counters, the event recording circuit accordingly reads two bits of data as the state of each respective edge counter. In some embodiments, the event recording circuit and the edge counters may be arranged so that the event recording circuit may also read for each edge counter, together with the current state of the edge counter, the current logic signal level at the location monitored by the edge counter. Thus the reading of each edge counter may produce three bits of data, consisting of the two-bit current state of the edge counter and a third bit to indicate the current logic state of the signal monitored by the edge counter.

In some embodiments, the IC die/event recording circuit may be programmed by software or otherwise to selectively enable or disenable certain ones of the edge counters, so that not all edge counters are necessarily read in every scanning cycle.

At 206, the event recording circuit stores in the DRAM 122 the edge counter states read at 204. In some embodiments the current logic signal level at the monitored locations may also be stored in the DRAM 122 with the edge counter states. Thus, in some embodiments, three bits are stored for each edge counter, consisting of the two-bit counter state plus a third bit indicative of the current logic signal level. In some embodiments the respective three bits for each of ten edge counters may be loaded together in a single 32-bit word in the DRAM. In addition, a sample number, counter number (other than an edge counter state) or other data may serve as a time stamp for the edge counter states and current logic level bits stored in a given scanning cycle (which may correspond to a complete pass through the loop shown in FIG. 2), and may be stored in association with the edge counter states/current logic level bits. Of course, no data may be stored for edge counters not enabled in the current scanning cycle.

The event recording circuit 120 may have capabilities akin to DMA (direct memory access) capabilities to handle storing of the edge counter state/current signal state data in the DRAM 122.

The DRAM (or a portion thereof) may be operated as a circular buffer to store the edge counter state/current logic level data for a number of scanning cycles, with data from the current cycle being written over data from the oldest cycle. Each scanning cycle may be considered a separate occasion on which each (enabled) edge counter is read. Thus plural edge counters may be read (e.g., all enabled counters) in each scanning cycle, and each edge counter, so long as it is enabled, may be read in plural scanning cycles.

After 206, the process may be repeated again at the next appointed time to perform the next scanning cycle.

Figure 3:
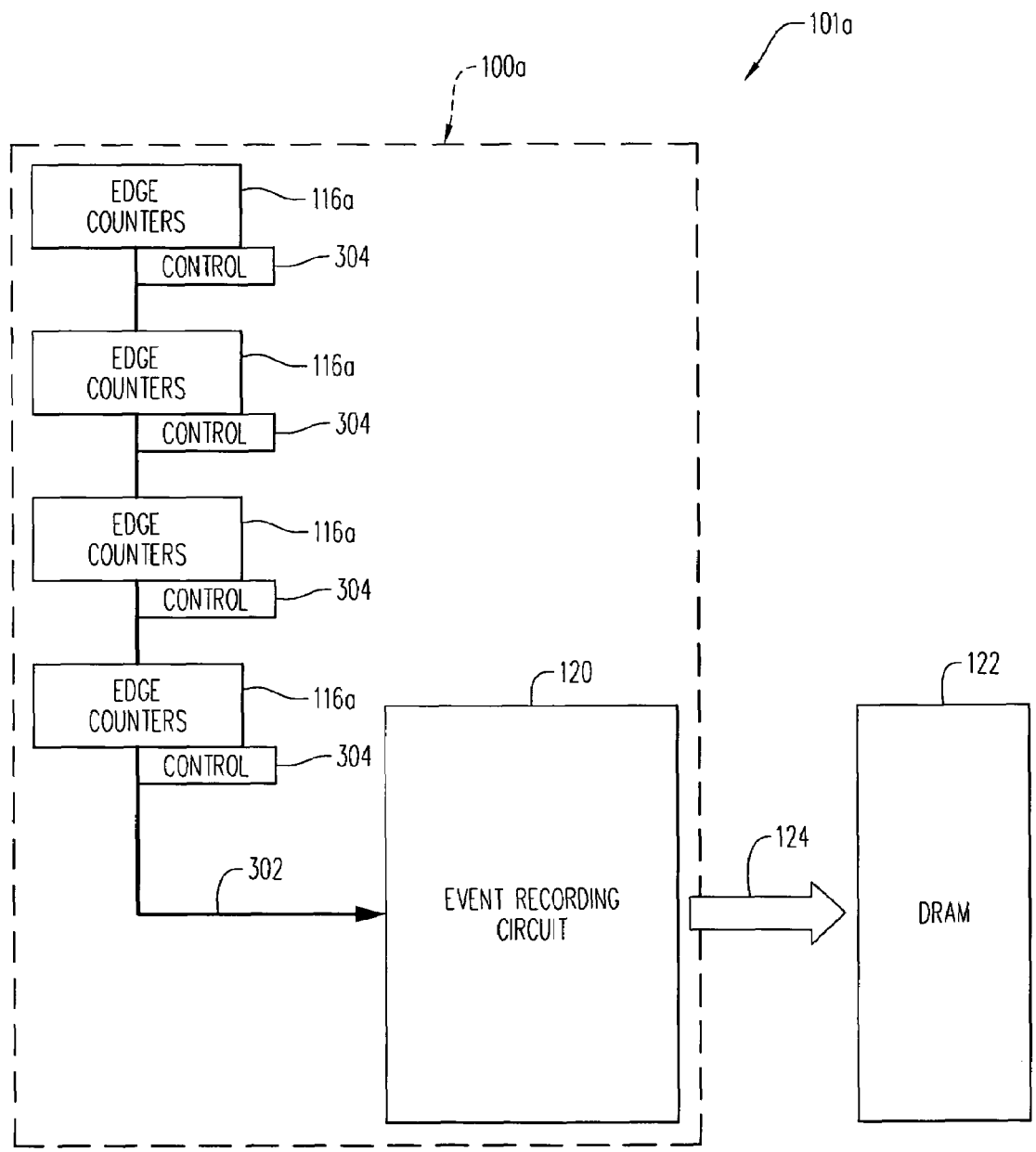
FIG. 3 is a schematic block diagram of an apparatus provided according to other embodiments.

FIG. 3 is a schematic block diagram of an apparatus 101a that includes an IC die 100a provided according to other embodiments. The IC die 100a may be similar to IC die 100 except that in IC die 100a, the edge counters 116a need not be located adjacent the event recording circuit 120. Rather each edge counter 116a may be located at or near the location which it monitors. Thus the edge counters 116a may be located at various locations in the operational circuit blocks of the IC die 100a (which are not shown in FIG. 3 in order to simplify the drawing). Each block 116a of edge counters may for example include five edge counters (not separately shown) to be serviced simultaneously by the signal bus 302 which may have 16 bit parallel capability. Although only four blocks of edge counters 116a are explicitly shown in FIG. 3, there may in practice be many more edge counters formed on the IC die, or any number of edge counters. The edge counters 116a may be coupled to the event recording circuit 120 via a bus 302, to allow the event recorder circuit 120 to read the edge counters via the bus. The bus may be dedicated to scanning the edge counters or may be shared with another function or functions. For example, the bus 302 may also be used to selectively output signals from operating units (not shown in FIG. 3) of the IC 100a to test pins (not shown) for reading by a logic analyzer (not shown).

A respective control circuit 304 may be provided in association with each block of edge counters to selectively couple the edge counters to the bus 302 and to clear the edge counters upon the edge counters being read by the event recording circuit 120. The bus 302 may include control signal lines in addition to data lines to allow the event recording circuit 120 to control the control circuits 304.

The event recording circuit 120 of IC die 100a may operate in similar fashion to the event recording circuit of IC die 100 to perform the process described above in connection with FIG. 2.

Because the edge counter state data (and also possibly the current signal levels) is (are) stored in the memory 122, with indications of the timings at which the data was collected, software operating on the IC die with access to the memory 122 is able to determine types and timings of hardware events that may occur, for example, during a debugging process. The software may also be aware of software events (generated by itself or other software) and the timing thereof, and may be able to compare and/or correlate the timings of both hardware and software events. In some embodiments, debugging software with access to the stored edge counter data may display simultaneously to a user indications of the timing of both hardware and software events to aid the user in gaining an overview of issues relevant to a debugging process. This may allow much more rapid and efficient debugging of software or other aspects of the platform represented by the IC die.

Figure 4:
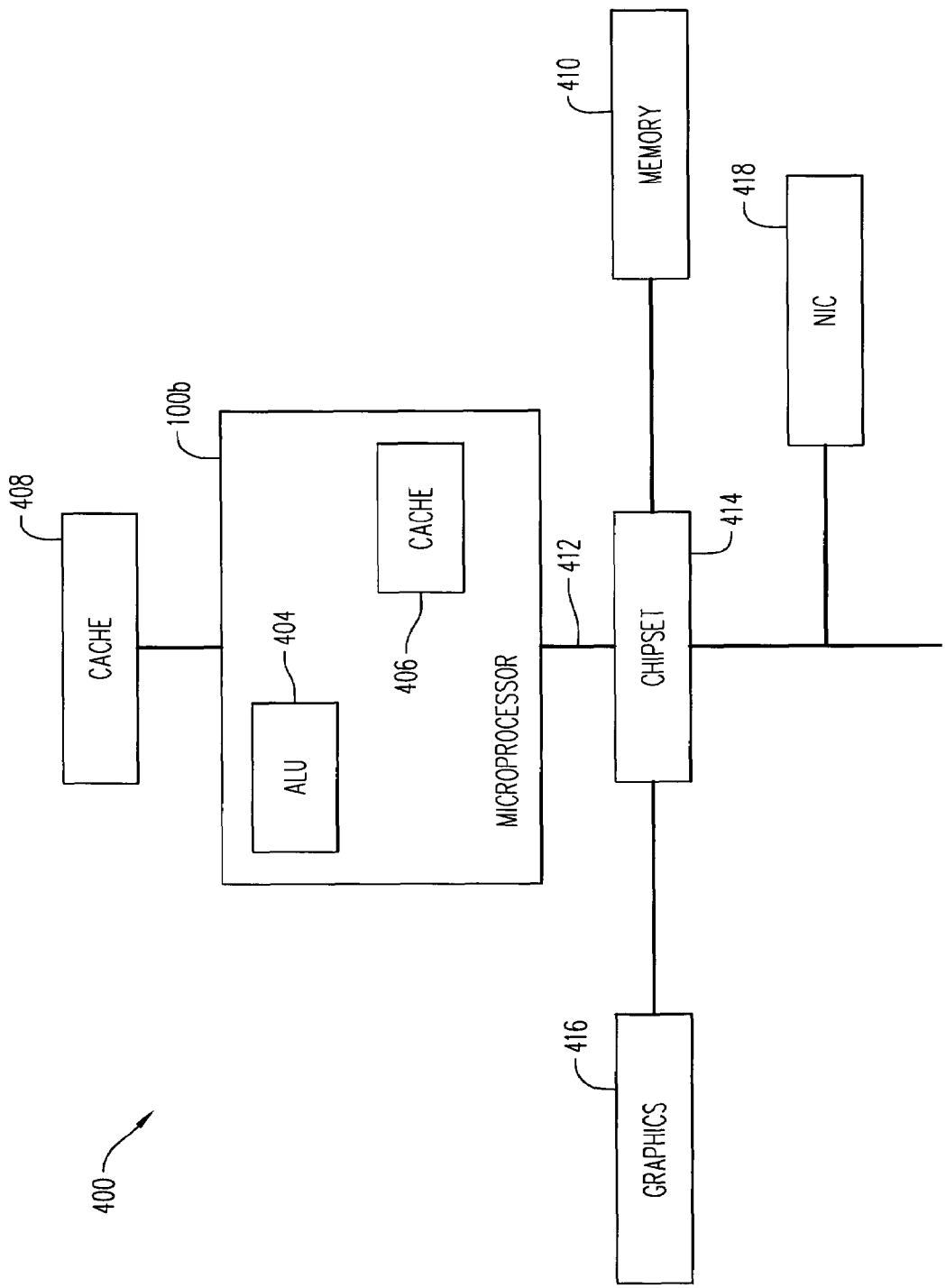
FIG. 4 is a block diagram of a computer system that includes an example of an IC die provided according to some embodiments.

FIG. 4 is a block diagram of a computer system 400 that includes an example of an IC die 100b provided according to some embodiments. Unlike the IC die 100a or 100b, the IC die 100b may essentially or primarily be or function as a microprocessor rather than an SoC. However, the IC die 100b has the same or similar edge counters as the IC die 100a or 100b and also has the same or similar event recording circuit to store edge counter states in an on-chip memory.

In FIG. 4, microprocessor die 100b may comprise many sub-blocks, such as arithmetic logic unit (ALU) 404, and on-die cache 406. Microprocessor 100b may also communicate to other levels of cache, such as off-die cache 408. Higher memory hierarchy levels, such as system memory 410, are accessed via host bus 412 and chipset 414. In addition, other off-die functional units, such as graphics accelerator 416 and network interface controller (NIC) 418, to name just a few, may communicate with microprocessor 100b via appropriate busses or ports.

Process stages presented herein as sequential may be simultaneously performed and/or process stages presented herein as simultaneous may be sequentially performed or may be performed in an order other than that shown in FIG. 2.

The IC die which incorporates hardware event detection and storage capabilities as described herein need not be an SoC or a microprocessor, but rather may be any type of digital or partly digital integrated circuit.

In some embodiments, the IC having the edge counters and the event recording circuit may be a field programmable gate array (FPGA). In other embodiments, an IC such as that described herein may perform only a single function and/or may be carried on a plug-in card.

Although the IC 100 shown in FIG. 1 includes an event recording circuit to serve all of the operating units of the IC, in other embodiments one or more of the operating units may each have a respective event recording circuit dedicated to the particular operating unit.

In some embodiments, the bus 302 shown in FIG. 3 may be carried over to one or more additional ICs to allow the event recording circuit to service edge counters formed on a different IC from the event recording circuit. In some embodiments, all of the edge counters serviced by the event recording circuit may be formed on one or more different ICs from the event recording circuit.

Operation of the event recording circuit may be modified in some embodiments such that if the state of an edge counter is unchanged from a previous scanning cycle, the edge counter state is not stored again in the current scanning cycle. Thus, in a given scanning cycle, there is stored (with a time stamp) only data to identify, and to indicate the current state of, edge counters that have changed state since the last scanning cycle. This may reduce the memory bandwidth required to implement the functions of the event recording circuit.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. An apparatus, comprising:
   an integrated circuit (IC) die having a plurality of edge counters formed thereon, each edge counter to detect at least one change in signal level at a respective location on the IC die;
   a memory; and
   an event recording circuit formed on said IC die to store states of said counters in said memory;
   wherein each of said edge counters is a two-bit counter.

2. The apparatus of claim 1, wherein:
   a "0" (binary "00") state of an edge counter indicates there has been no change in a logic level at the respective location since the edge counter was last cleared;
   a "1" (binary "01") state of the edge counter indicates that the logic level at the respective location has changed once and only once since the edge counter was last cleared;
   a "2" (binary "10") state of the edge counter indicates that the logic level at the respective location has changed twice and only twice since the edge counter was last cleared; and
   a "3" (binary "11") state of the edge counter indicates that the logic level at the respective location has changed at least three times since the edge counter was last cleared.

3. An apparatus, comprising:
   an integrated circuit (IC) die having a plurality of edge counters formed thereon, each edge counter to detect at least one change in signal level at a respective location on the IC die;
   a memory; and
   an event recording circuit formed on said IC die to store states of said counters in said memory;
   wherein the event recording circuit is operative to clear the edge counters upon storing the states of the edge counters in the memory.

4. An apparatus, comprising:
   an integrated circuit (IC) die having a plurality of edge counters formed thereon, each edge counter to detect at least one change in signal level at a respective location on the IC die;
   a memory; and
   an event recording circuit formed on said IC die to store states of said counters in said memory;
   wherein the states of the edge counters are stored in the memory in association with time stamps to indicate times at which the edge counter values were stored.

5. A system comprising:
   a die comprising a microprocessor;
   a memory in communication with the microprocessor; and
   a chipset in communication with the microprocessor;
   wherein the die comprises:
     a plurality of edge counters, each edge counter to detect at least one change in signal level at a respective location on the die; and
     an event recording circuit on said die to store states of said counters in said memory;
   wherein the event recording circuit is operative to clear the edge counters upon storing the values of the edge counters in the memory.

6. The system of claim 5, wherein said edge counters are located on said die adjacent said event recording circuit, at least some of said edge counters each being connected by a respective signal line to the respective location on the die.

7. The system of claim 5, wherein each of said edge counters is located at the respective location on the die, and the die further comprises a signal bus to connect said edge counters to said event recording circuit.

* * * * *